United States Patent [19]

Flaynik

[11] Patent Number: 5,040,289

[45] Date of Patent: Aug. 20, 1991

[54] EXTRACTION TOOL

[75] Inventor: Anthony J. Flaynik, New Cumberland, Pa.

[73] Assignee: AMP Incorporated, Harrisburg, Pa.

[21] Appl. No.: 565,852

[22] Filed: Aug. 10, 1990

Related U.S. Application Data

[63] Continuation of Ser. No. 414,560, Sep. 29, 1989, abandoned.

[51] Int. Cl.[5] ........................................ H05K 13/04

[52] U.S. Cl. ........................................ 29/764; 29/758

[58] Field of Search .......................... 29/741, 764, 758

[56] References Cited

U.S. PATENT DOCUMENTS

| | | | |
|---|---|---|---|
| 3,110,093 | 11/1963 | Johnson | 29/764 X |
| 3,380,141 | 4/1968 | Rofer | 29/764 |
| 3,451,117 | 6/1969 | Cameron | 29/764 |
| 3,541,661 | 11/1970 | Nava | 29/764 X |
| 3,624,887 | 12/1971 | Hilbert | 29/764 |
| 3,802,049 | 4/1974 | Hennessey, Jr. | 29/764 |
| 4,820,174 | 4/1989 | Farrar et al. | 439/95 |

*Primary Examiner*—Carl E. Hall

*Attorney, Agent, or Firm*—Katherine A. Nelson

[57] ABSTRACT

A tool 10 for extracting an electrical terminal member 36 from a terminal receiving passageway 56 of an electrical connector 50 comprises a body portion 12 having an aperture 20 extending axially thereinto, aperture 20 being adapted to receive a section 38 of terminal member 36 therewithin. Aperture 20 has first and second sections 22, 24, the first section 22 being dimensioned to slidably receive the terminal section 38 therewithin and the second section 24 having a reduced inner dimension such that second aperture section 24 provides an interference fit with the terminal section 38. The outer dimensions of the tool body portion 12 are adapted to be received in the terminal receiving passageway 56. Terminal member 36 includes rearward and forward stop means 44, 46, terminal member 36 being restrained from rearward axial movement by stop surfaces 60 within connector housing means 52 cooperable with the rearward terminal stop means 46. Terminal member 36 is releasably secured from forward axial movement by latching means 66 extending from surfaces of passageway 56 and radially inwardly and adapted to be deflected radially outwardly. Upon inserting tool 10 into passageway 56, forward portion 38 of terminal member 36 enters first aperture section 22 and moves slidably therealong, forward portion 38 then enters smaller second aperture section 24 as tool 10 is moved into passageway 56 and tool 10 concomitantly deflects the latching means 66 radially outwardly. Upon full insertion of tool 10, a substantial length of terminal portion 38 is securely held by interference fit within said second aperture section 24 such that upon withdrawal of tool 10 from connector 50, terminal member 36 is pulled forwardly therewith and removed from connector 50.

6 Claims, 3 Drawing Sheets

16
39
24
26
8
36
14
7
12
42
40
10
30
20
18
22
38
44
46
52
54
56
50

12
14
16
18
20
22
24
25
26
30
36
38
39
40
42
44
46
52
53
54
55
56
58
60
64
66
68

EXTRACTION TOOL

This application is a continuation of application Ser. No. 07,414/560 filed Sept. 29, 1989, now abandoned.

FIELD OF THE INVENTION

The present invention relates to an extraction tool for removing electrical contact terminals from electrical connectors.

BACKGROUND OF THE INVENTION

Electrical connectors typically include housing means having a plurality of terminal receiving passageways extending therethrough and in which are disposed electrical terminal members. The internal structure of the housing means provides means that cooperates with portions of the terminal members to secure the terminal members within the housing. Electrical contact terminals are retained in connector housings in a variety of conventional ways. Certain retention methods permit removal of the terminal while others do not. Conventional methods for permitting removal include integrally forming locking fingers on internal passageways of a connector or with a separate retainer clip, the fingers extending laterally at an appropriate angle to engage stop surfaces along the terminal surfaces to secure the terminal against withdrawal and are deflectable away from the terminal and away from the stop surfaces by a tool inserted into the passageway alongside the terminal whereafter the terminal is withdrawn such as for repair or replacement. The locking fingers of the housing or locking clip are initially deflected outwardly by the terminal during insertion and are tool deflectable for terminal removal.

A variety of retention clips are known, which mostly comprise cylindrical metal sleeves which are stamped and formed to have locking fingers which engage an annular collar of a terminal and which are retained in the passageway such as by locking lances. It is desirable that the tool and method used to remove terminals from a connector be one that allows the terminal to be removed without requiring complete dismantling of the electrical connector. Additionally it is desirable that the terminals be replaceable from the front or mating face of the connector so that a connector mounted to a circuit board for example would not require removal of the connector from the circuit board to repair and/or replace only one damaged contact member. One such example is illustrated in U.S. Pat. No. 4,820,174, which discloses a modular connector assembly and a filtered terminal member that is releasably mounted in a connector housing. The terminal member is mounted into and is releasable from the front mating face of the housing.

In order to replace such a contact terminal member, it is necessary to insert a tool into the housing to deflect latching means or other securing means to enable the terminal to be released and removed. One such tool, as known in the art, comprises a tubular member having a cavity extending partially therein for receiving a terminal member. The internal surface of the tubular member includes an inwardly extending projection or dimple, which is designed to frictionally engage the terminal member and grip the member while it is withdrawn from the connector. The cavity of the tool is sufficiently long enough to receive the terminal member therewithin and to reach beyond the latching means securing the terminal member within the housing and to allow the terminal member to be withdrawn from the housing. One disadvantage of a tool of this type is that the dimple provides only a small surface area for gripping the terminal member, thus the tool may fail to grip the terminal member securely enough to effect complete withdrawal of the terminal member from the connector housing. Another disadvantage of a tool of this type is that the wall as the tube is continuous and during use, portions of the damaged terminal member being removed may become damaged, break off and become lodged within the tubular member thus rendering the tool ineffective for subsequent use until the broken portion is removed from the tool's cavity. Since the presence of the broken portion inside the tubular cavity can not be seen by the user, the partially blocked cavity may in fact not be discovered until the tool is used on a subsequent occasion to remove a terminal member. It is desirable therefore, to have a means, preferably visual, to assure that an extraction tool is not blocked or partially blocked by a broken terminal member.

SUMMARY OF THE INVENTION

The present invention is directed to an improved extraction tool that overcomes the deficiencies and disadvantages of the prior art. The tool comprises a body portion having an aperture extending axially thereinto from a forward face thereof, the outer dimensions of the body portion being adapted to be received in a terminal receiving passageway of a connector housing. The aperture of the tool is adapted to receive a portion of a terminal member therewithin. The aperture includes at least first and second sections with the first section being dimensioned to slidably receive a first terminal section therewithin and the second aperture section being dimensioned with a reduced inner dimension such that the second aperture section provides an interference fit with the first terminal section as the tool is inserted into passageway in the connector housing.

The tool in accordance with the invention is designed to remove terminal members of the type including a first section having a predetermined outer shape and size and having forward and rearward stopping means. The terminal is restrained from rearward axial movement by stop surfaces within the housing cooperable with the terminal rearward stop means. The terminal member is releasably secured in the terminal receiving passageway by latching means extending from and rearwardly along surfaces of the passageway and extending radially inwardly and adapted to be deflected radially outwardly to release the terminal. The latching means defines rearwardly facing stop surfaces that cooperate with forward facing stop surfaces of the terminal member. The latching means retains the terminal member in the passageway against forward axial movement upon full insertion of the terminal member thereinto.

Upon disposing the body portion of the tool over the terminal member selected to be removed from a connector housing and inserting the tool into the terminal receiving passageway of the housing, the forward portion of the terminal member enters the first aperture section from a forward face thereof and moves slidably therealong. The first portion then enters the reduced dimensioned second aperture section as the tool is moved into the passageway while rearward stop surfaces of the housing prevent the terminal from moving rearwardly. Concomitantly the tool deflects the latching means radially outwardly and upon full insertion of the tool therein the forward face of the tool body portion engages the forward stop surface of the terminal member. The first terminal portion is securely held by interference fit within the second aperture section such that upon withdrawal of the tool from the connector housing means the terminal member is pulled forwardly therewith and is removed from the connector.

In the preferred embodiment the contact terminal member is an essentially round member and the aperture of the tool is a bore extending from a forward to a rearward end thereof with the rearward end of the body portion attached to a handle member. The external diameter of the tool body portion is slightly smaller than the diameter of a terminal receiving passageway within the connector housing. The second body section of the preferred embodiment includes an elongated aperture or slot extending longitudinally along a portion thereof and in communication with the longitudinally extending bore. During the extraction process, the forward section of the terminal member is moved into the second bore section and the end thereof is exposed in the slot thus enabling the user of the tool to determine if the terminal member has been removed completely from the tool subsequent to extraction from the connector.

While the invention is disclosed showing a round terminal member, it is to be understood that this shape is representative of terminal members suitable for use in an appropriately configured tool body member. The tool could be shaped, for example, with a body member having a square cross section for insertion into an essentially square terminal receiving passageway and having an inner aperture with a round or square cross section for removal of round or square shaped terminal members respectively. For purposes of illustration the terminal member is shown as a socket terminal. It is to be also understood that other terminal configurations may be used with the tool of the invention.

It is an object of the invention to provide an extraction tool for removing electrical contact terminals from connector housing from the front face thereof.

It is a further object of the invention to provide a means to ascertain whether the terminal member has been completely removed from the tool after extraction from the connector.

It is also an object of the invention to provide a tool that will securely grip the terminal member during the extraction process.

The invention itself, together with further objects and attendant advantages of the invention will be best understood by reference to the following detailed description, taken in conjunction with the accompanying drawing.

BRIEF DESCRIPTION OF THE DRAWING

FIG. 3 is a fragmentary sectional view of a terminal member within a connector housing and a fragmentary portion of the tool aligned with the terminal member prior to disposing the tool over the terminal.

FIG. 4 is a fragmentary sectional view illustrating the tool fully seated in the connector housing and having the terminal member fully inserted therein.

FIG. 5 is a fragmentary sectional view showing the terminal member fully removed from the connector housing.

DETAILED DESCRIPTION OF THE PREFERRED EMBODIMENT

Figures 1, 6:
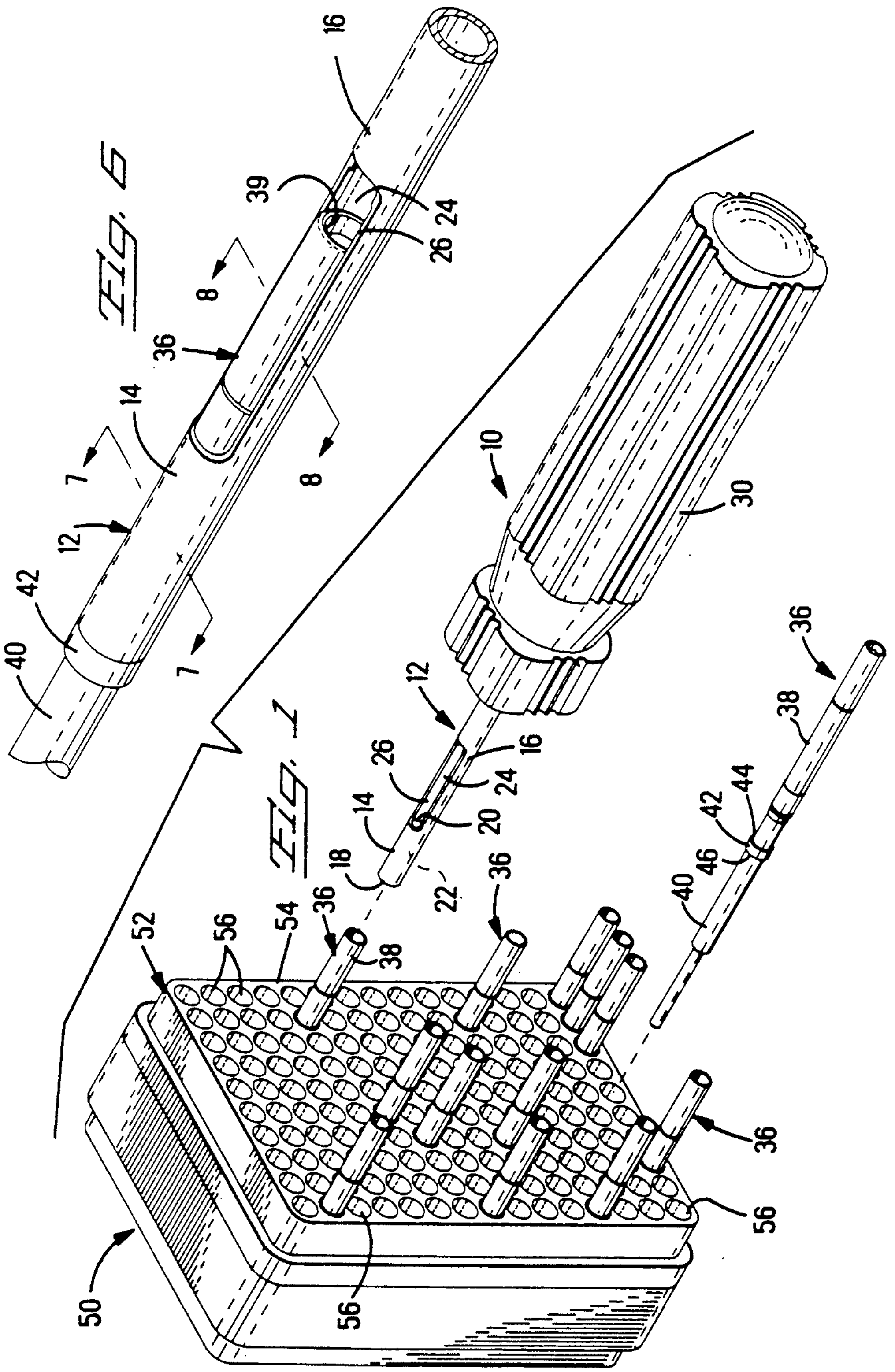
FIG. 1 is a perspective view of an electrical connector having a plurality of terminal members therein, one of which is exploded from the housing, and one of which is aligned with a tool made in accordance with the invention prior to the terminal being removed from the connector.
FIG. 6 is a fragmentary perspective view of the tool having the extracted terminal therein.
Figure 2:
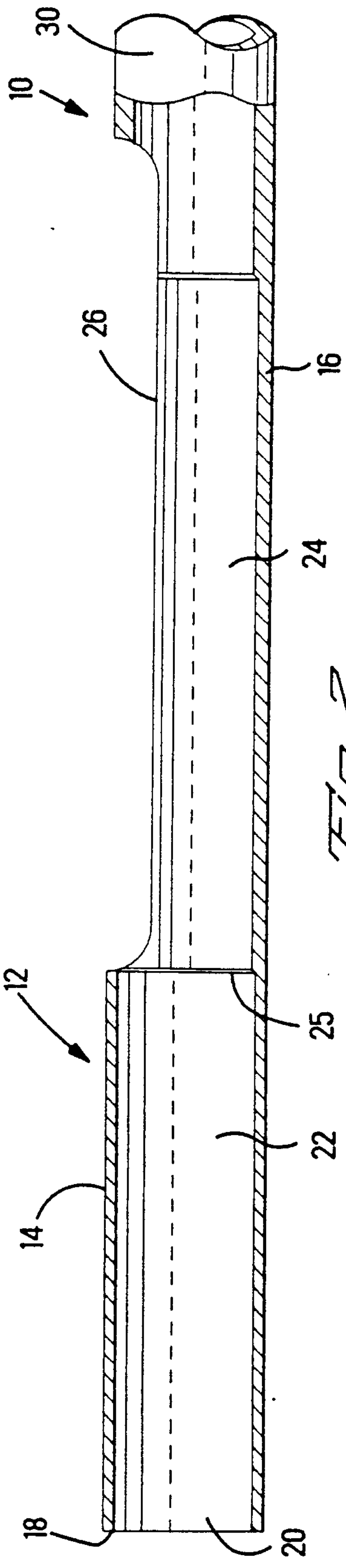
FIG. 2 is a longitudinal sectional view of the body portion of the tool of FIG. 1.

FIGS. 1 and 2 show a tool 10 made in accordance with the invention for extracting an electrical terminal member 36 from a terminal receiving passageway 56 in housing means 52 of an electrical connector 50. The tool 10 comprises a body portion 12 and a handle portion 30. Body portion 12 has first and second body sections 14, 16 respectively and an aperture 20 extending axially thereinto from a forward face 18 thereof. Aperture 20 has a first section 22 and a second section 24. The outer diameter of the body section is dimensioned and adapted to be received within the terminal passageways 56 of connector 50.

Figure 8:
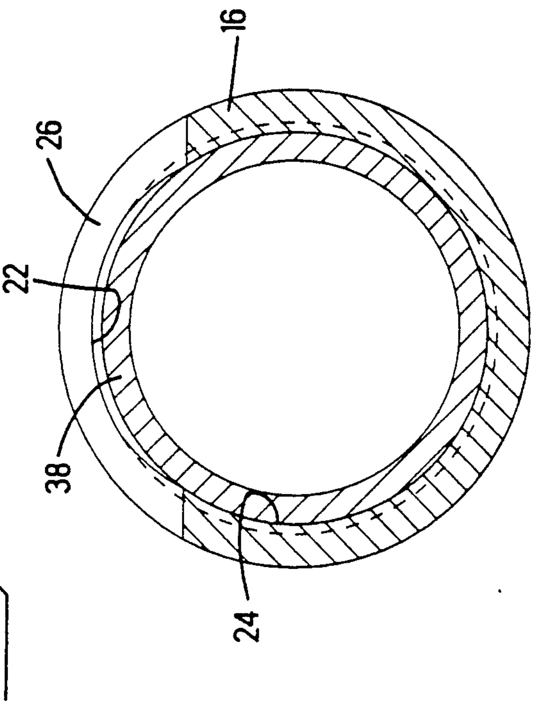
FIG. 8 is a cross-sectional view taken along the line 8—8 of FIG. 6.
Figure 7:
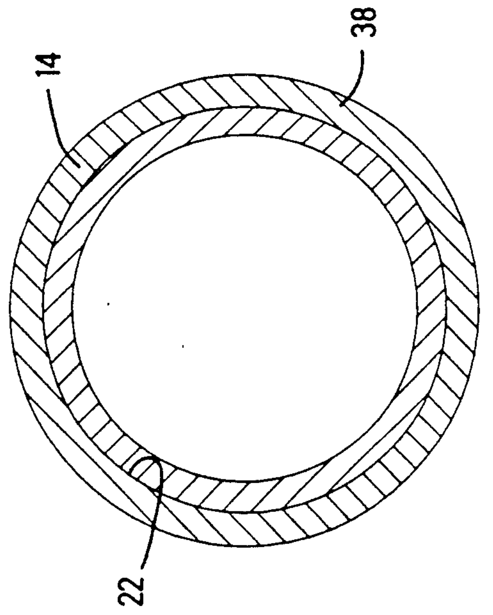
FIG. 7 is a cross-sectional view taken along line 7—7 of FIG. 6.
Figures 3, 4, 5:
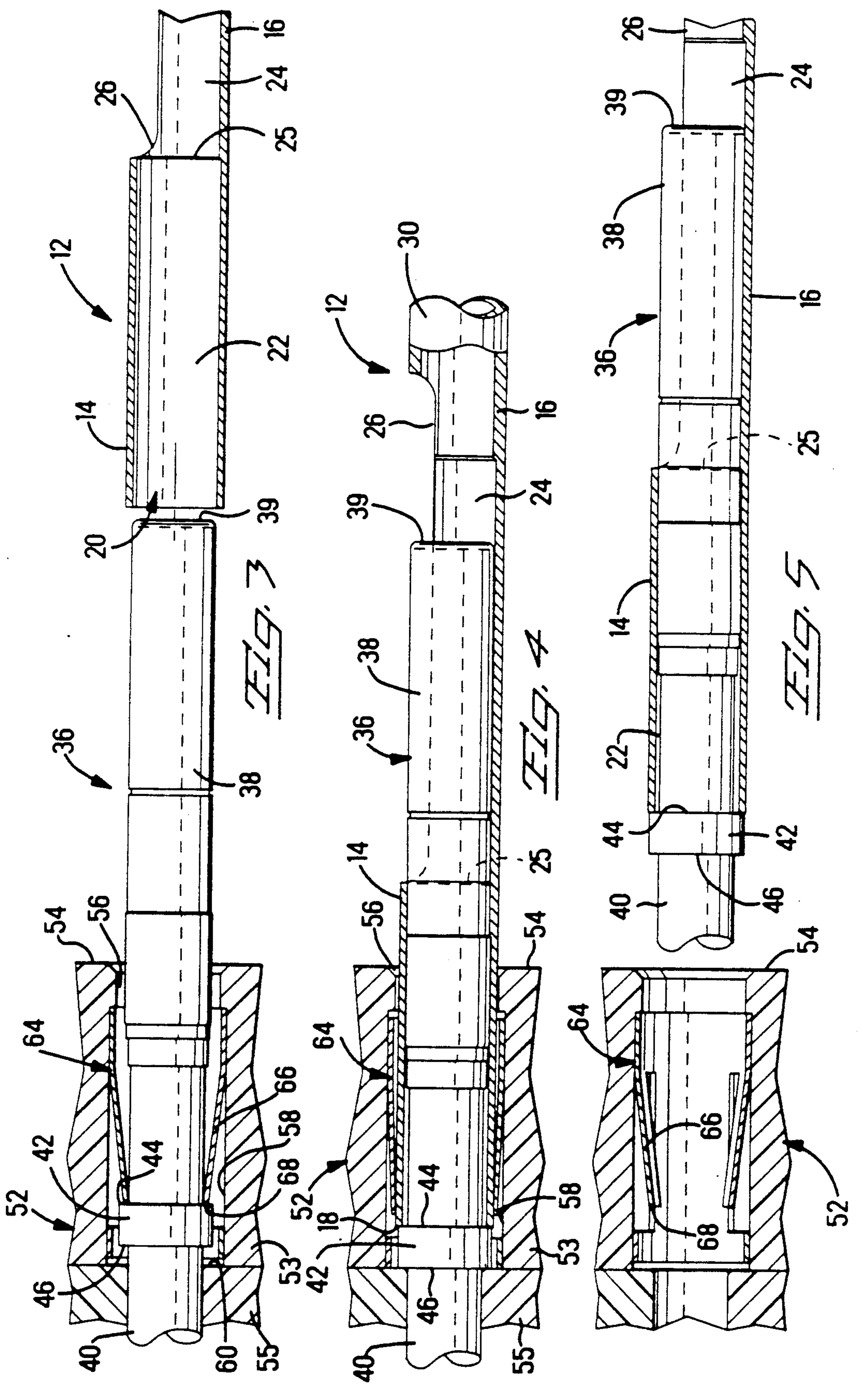
FIGS. 3 through 5 illustrate the operation of the tool.

As shown in FIGS. 1 and 3 through 5, terminal member 36 includes a forward portion 38, rearward portion 40, and stop means 42 intermittent thereof. Stop means 42 includes forward and rearward stop surfaces 44, 46 respectively. In the embodiment shown terminal member 36 has a circular forward portion which is received in the circular bore 20 of tool 10 during the extraction process as shown in FIGS. 3 through 5. The first aperture section 22 of tool 10 is dimensioned to slidably receive first terminal section 38 therewithin and the second aperture section 24 has a reduced inner dimension such that the second aperture section 24 provides an interference fit with the first terminal section 38, as best seen in FIGS. 7 and 8. The frictional force created between first terminal portion 38 and second tool body portion 24 is low enough to permit tool 10 to be inserted over terminal portion 38 yet high enough to grip the terminal member 36 securely along a substantial length thereof during the extraction process.

Connector 50 is comprised of housing means 52 having a plurality of terminal passageways 56 extending therein from a front face 54 thereof, as is shown in FIG. 1. Housing means 52 is of the type having two housing portions 53, 55 which meet at an interface such that a portion of housing 55 forms a rear stop surface 60 which cooperates with rear stop surface 46 of terminal stop means 42 to prevent rearward axial movement of the terminal member 36 within the housing means 52 both during use and during the terminal extraction process. The internal structure of the latching means within connector 50 is best seen by referring to FIGS. 3 through 5. In the embodiment shown, the latching means comprises a latching clip 64 having a plurality of rearwardly extending inwardly directed latch arms 66. The rearward edges 68 of the latching arms 66 define rearward stop surfaces that cooperate with the forward stop surface 44 of terminal stop means 42 to prevent forward axial movement of terminal member 36 within terminal receiving passageway 56.

The operation of the tool 10 of the invention is illustrated by referring to FIGS. 3 through 5 wherein body member 12 of tool 10 is aligned with terminal member 36 such that forward terminal portion 38 enters first aperture section 22 of first body portion 14 and is slidably received therein. FIG. 4 illustrates the full insertion of the tool 10 into terminal receiving passageway 56 of housing means 52 such that the forward face 18 of first body portion 14 is seated against forward stop surface 42. As first body portion 14 of tool 10 moves into the terminal latching arms 66 are deflected radially outwardly to remove the rearward ends 68 of arms 66 from engagement with forward stop surface 44 of terminal member 36. Concomitantly with moving the tool 10 into passageway 56, first portion 38 of terminal member 36 moves into the reduced diameter second aperture portion 24 at 25 and is secured therein along the length thereof.

FIGS. 7 and 8 are cross sections taken along the respective lines 7—7 and 8—8 of FIG. 6 showing terminal member 36 disposed in bore 20 illustrating the difference in the diameters of the forward and rearward bore sections 22 and 24 of tool 10. In FIG. 8 the circumference of first aperture portion 22 is shown by the solid and broken line.

FIG. 5 illustrates the removal of the tool 10 and the terminal member 36 disposed therein. As tool 10 and terminal member 36 are withdrawn from aperture 56, latch arms 66 again deflect inwardly into the passage 56. As shown in FIG. 6 first portion 38 of terminal member 36 is disposed along a substantial length thereof within the smaller dimensioned second aperture section 24 of second body portion 16. FIG. 6 also shows a slot 26 extending longitudinally through a portion of second body section 16 and into second aperture section 24. As can be appreciated, slot 26 provides access to the forward end 39 of terminal 38, thus enabling the use of a finger or tool to assist in removing terminal member 36 from the tool 10, if necessary. Typically the terminal member 36 is removed from tool 10 by pulling the terminal member 36 along second portion 40.

Tool 10 is preferably made from commercially available stainless steel tubing having the desired exterior diameter and an inner diameter that is smaller than both of the desired diameters of the first and second aperture sections 22, 24 of the tool. The respective inner diameters of the tube are then machined to the desired dimensions and slot 26 is added in the smaller diameter section 24.

As can be seen from the figures, tool 10 of the present invention provides a means whereby a relatively substantial length of the terminal member 36 is securably held within bore portion 24 to securably hold the terminal member 36 within tool 10 during the extraction process. Slot 26 in rearward body portion 18 provides some clearance in the interference portion of the tool thereby allowing terminal section 38 to become slightly deformed and thus reducing the amount of insertion force needed to achieve full insertion of tool 10 into passageway 56. In addition, slot 26 provides access to the bore section 24 so that if portions of terminal member 36 break or become disengaged from the remaining portions of terminal member 36, fragmentary sections will not be retained within the tool upon removal of the terminal member 36. Furthermore the user of tool 10 can readily and visually ascertain whether the tool is ready to be used to remove another terminal.

In using tool 10, it is important that the tool be "bottomed out" against the forward stop surface 44 of terminal member 36, as shown in FIG. 4, to ensure that the lances 66 have been deflected from engagement with forward stop surface 44 of terminal stop means 42. While the preferred embodiment is shown as a terminal member having a circular cross-section, it is to be understood that the terminal member and concomitantly the internal shape of aperture 20 of tool 10 may have different configurations such as for example rectangular, triangular, or other geometric configurations. It is also to be understood that the external geometric shape of the tool body may also be altered to conform with the shape of the terminal receiving passageway of the connector with which the tool is to be used. It is to be further understood that the external shape of the tool body need not be the same as the shape of the aperture within the tool body.

It is thought that the contact extraction tool of the present invention and many of its attendant advantages will be understood from the foregoing description. Changes may be made in the form, construction and arrangement of parts thereof without departing from the spirit and scope of the invention or sacrificing all of its material advantages.

I claim:

1. A tool for extracting an electrical terminal member from a terminal receiving passageway in housing means of an electrical connector, said terminal member including a first section having a predetermined outer shape and size and having rearward and forward stop means, said terminal member being restrained from rearward axial movement by stop surfaces within said housing means cooperable with said terminal rearward stop means and releasably secured in said passageway from forward axial movement by latching means extending from surfaces of said passageway radially inwardly and adapted to be deflected radially outwardly, said latching means defining rearwardly facing stop surfaces cooperable with forward facing stop surfaces about said terminal member, said latching means retaining said terminal in said passageway against forward axial movement upon full insertion of the terminal member thereinto, said tool comprising:

a body portion having a terminal receiving aperture extending axially thereinto from a forward face thereof, the outer dimensions of said body portion being configured to be received in said terminal receiving passageway;

said aperture having at least first and second sections, said first aperture section being dimensioned to slidably receive said first terminal section therewithin during terminal removal;

said second aperture section extending rearwardly from said first aperture section and having at least a reduced inner dimension such that said second aperture section provides an interference fit with the first terminal section;

means for deflecting said terminal latching means of said housing means radially outwardly for releasing said terminal from said housing means;

means for engaging said terminal within said aperture for removal of said terminal from said passageway; and said tool body portion further including a slot extending longitudinally therealong that provides access to said second aperture section, said slot being dimensioned to expose a forward end of said first terminal section upon full insertion of said terminal member into said body portion, said slot positioned a selected distance from the front end of the tool, said slot defining an opening having a circumferential distance of about 90° to about 180° of the body portion, said terminal forward end assuredly being exposed in said slot defining an opening closely associated with the front end of the tool to correspond with the distance of the terminal end with respect to the base of the terminal receiving passageway of the connector housing, thereby enabling said tool to be an integral member providing access to the terminal front end for withdrawal of a terminal member from said tool whereby the tool member no movable ejector mechanism.

2. The tool of claim 1 wherein said deflecting means is the leading end of said body portion.

3. The tool of claim 1 wherein said terminal engaging means is said second aperture section.

4. A tool for extracting an electrical terminal member form a terminal receiving passageway in housing means of an electrical connector, said terminal member including a first section having a predetermined outer shape and size and having rearward and forward stop means, said terminal member being restrained from rearward axial movement by stop surfaces within said housing means cooperable with said terminal rearward stop means and releasably secured in said passageway from forward axial movement by latching means extending from surfaces of said passageway and radially inwardly and adapted to be deflected radially outwardly, said latching mean defining rearwardly facing stop surfaces cooperable with forward facing stop surfaces about said terminal member, said latching means retaining said terminal in said passageway against forward axial movement upon full insertion of the terminal member thereinto, said tool comprising:

a body portion having a terminal receiving aperture extending axially thereinto from a forward face thereof, the outer dimensions of said body portion being configured to be received in said terminal receiving passageway;

said aperture having at least first and second sections, said first aperture section being dimensioned to slidably receive said first terminal section therewithin during terminal removal;

said second aperture section extending rearwardly from said first aperture section and having at least a reduced inner dimension such that said second aperture section provides an interference fit with the first terminal section;

means for deflecting said terminal latching means of said housing means radially outwardly for releasing said terminal from said housing means;

means for engaging said terminal within said aperture for removal of said terminal from said passageway; and said tool body portion further including a slot extending longitudinally therealong that provides access to said second aperture section, said slot being dimensioned to expose a forward end of said first terminal section upon full insertion of said terminal member into said body portion, said slot defining an opening having a circumferential distance of about 90° to about 180° of the tool body section to expose the forward terminal end to be easily engaged by a stylus-like object and pushed for removal from the tool, thereby enabling said tool to be an integral member providing access to the terminal front end for withdrawal of a terminal member from said tool whereby the tool needs no movable ejector mechanism.

5. The tool of claim 4, wherein said deflecting means is the leading end of said body portion.

6. The tool of claim 4, wherein said terminal engaging means is said second aperture section.

* * * * *

UNITED STATES PATENT AND TRADEMARK OFFICE

CERTIFICATE OF CORRECTION

PATENT NO. : 5,040,289

DATED : August 20, 1991

INVENTOR(S) : Anthony J. Flaynik

It is certified that error appears in the above-identified patent and that said Letters Patent is hereby corrected as shown below:

Claim 1, Column 7, Line 12 - delete the word "member" and insert the word --needs--.

Claim 4, Column 7, Line 18 - delete the word "form" and insert the word --from--.

Signed and Sealed this

Twenty-seventh Day of October, 1992

Attest:

DOUGLAS B. COMER

*Attesting Officer* *Acting Commissioner of Patents and Trademarks*